United States Patent [19]
Birth et al.

[11] Patent Number: 5,697,085
[45] Date of Patent: Dec. 9, 1997

[54] RADIO TRANSCEIVER COMPRISING AN ARRANGEMENT FOR COMPENSATING FOR A DC COMPONENT

[75] Inventors: Winfrid Birth, Veitsbronn; Erich Saur, Nürnberg, both of Germany

[73] Assignee: U.S. Philips Corporation, New York, N.Y.

[21] Appl. No.: 491,943

[22] PCT Filed: Dec. 8, 1994

[86] PCT No.: PCT/IB94/00401

§ 371 Date: Aug. 2, 1995

§ 102(e) Date: Aug. 2, 1995

[87] PCT Pub. No.: WO95/17047

PCT Pub. Date: Jun. 22, 1995

[30] Foreign Application Priority Data

Dec. 9, 1993 [DE] Germany ............ 43 41 937.2

[51] Int. Cl.$^6$ ............................................ H04B 1/10
[52] U.S. Cl. .................... 455/296; 455/338; 329/318; 329/349
[58] Field of Search .................. 455/295, 296, 455/298, 299, 309, 311, 312, 334, 337, 343, 214, 338, 303–305; 329/318, 349, 351; 375/319, 340, 317

[56] References Cited

U.S. PATENT DOCUMENTS

| | | | |
|---|---|---|---|
| 5,175,749 | 12/1992 | Ficht et al. | 375/319 |
| 5,212,826 | 5/1993 | Rabe et al. | 455/312 |
| 5,241,702 | 8/1993 | Dent | 455/304 |
| 5,422,889 | 6/1995 | Sevenhans et al. | 375/319 |

*Primary Examiner*—Nguyen Vo
*Attorney, Agent, or Firm*—Arthur G. Schaier

[57] ABSTRACT

A radio transceiver including a counter for outputting a DC compensation signal, an amplifier for receiving a input signal having a DC component and for receiving the DC compensation signal and forming a signal difference between the input signal and the DC compensation signal and a comparator for comparing the signal difference and a reference signal. The counter increases and decreases the DC compensation signal based on the output of the comparator such that the incrementation or decrementation of the counter is based on the DC component of the signal difference.

19 Claims, 2 Drawing Sheets

RADIO TRANSCEIVER COMPRISING AN ARRANGEMENT FOR COMPENSATING FOR A DC COMPONENT

BACKGROUND OF THE INVENTION

1. Field of the Invention

The invention relates to an electrical device, more specifically, a radio transceiver comprising an arrangement for compensating for a DC component in an input signal to be processed, the compensating arrangement comprising means for forming the signal difference between the input signal and a DC compensation signal depending on a DC component found.

2. Discussion of the Related Art

When AC signals are processed, for example, in audio amplifiers, radio receivers and the like, the AC signal is processed in stages. To determine a specific DC operating point, the AC signal is converted in a processing stage to a specific DC level. For example, coupling capacitors or coupling transformers which pass only the AC component to the following stage are inserted between the processing stages.

Coupling capacitors and coupling transformers have a specific size especially when used with low frequencies. While circuit arrangements comprising resisters, diodes, transistors and so on can easily be integrated in large numbers in integrated circuits, the volume of a coupling capacitor having a large capacitance prevents cost-effective integration. Such coupling capacitors are therefore to be provided as external components outside the integrated circuit. This increases the cost of the modules, the cost of the components of the modules and the size of the modules. A further detrimental effect of coupling capacitors having a large capacitance as they are necessary, for example, in mobile radio receivers for baseband processing of time multiplex signals (capacitances in the µF range) is that circuits comprising such large capacitors cannot be simply turned off after a receive burst of about 570 µsec in length to save battery capacity during the receive pauses of about 4 msec. As a result of the large turn-on and turn-off time constants, the circuit would not be able to adjust to the new receive burst sufficiently fast. Thus the baseband circuit would have to remain turned on continuously, which reduces the operating time of the battery.

In integrated circuits the individual processing stages are normally DC coupled. This means that a DC component of the input signal to be processed (for example, from a baseband mixer) either reduces the useful dynamic range of the circuit, or even brings the circuit to saturation, so that no function can be executed any more.

For example, from the data sheet of the integrated circuit AD 7002, which sets out the baseband processing for the transmit and receive paths of a GSM radio telephone; a DC compensation arrangement component comprising a digital offset register is known to compensate for an input voltage offset. A DC value measured during a calibration cycle is stored separately for each filter input of the IC in the digital offset register. The value of the DC component stored in the corresponding register is subtracted from the corresponding filter output signal during a cycle of normal operation. This measurement is to be repeated at least when the integrated circuit is initially used and, if a fluctuation of the DC component cannot be excluded, for example, as a result of temperature influences, at regular intervals. For a measurement during the calibration cycle, however, the input signal cannot be used, so that only the DC component is measured which is available even if there is no input signal. Neither is it possible to use the IC during the calibration operation.

SUMMARY OF THE INVENTION

It is an object of the invention to provide a device of the type defined in the opening paragraph in which a compensation is effected for the DC component contained in the input signal even when the device is in operation without any effect on the function of the device. In addition, the arrangement for compensating for the DC component is to be suitable both for discrete and for integrated structures.

In a device of the type defined in the opening paragraph this object is achieved in that the arrangement for compensating for the DC component comprises a counting device whose count direction is determined by the DC component found.

By subtracting the DC compensation signal from the input signal, the DC level can be set irrespective of the input DC level. The advantage of the circuit arrangement is then that the means for forming the signal difference can be arranged for measuring the DC component and for generating the DC compensation signal and have components that are easily integrable. The continuous measurement of the DC component in the input signal and the continuous formation of the DC compensation signal provide that the measured DC component is continuously eliminated while the device is in operation. The counting device is furthermore advantageous in that it can be designed to have no passive storage components such as, for example, capacitors. The counting speed of the counting device and the counter length determine the smoothing time constant. As integrated counters are arranged such that, in the turned-off state, they retain the count for very long periods of time (of the order of 100 days), the counting operation can be continued forthwith when the operating voltage is again applied to such a counting device. Therefore, such a circuit arrangement can particularly be applied advantageously to radio transceivers operating in the time slot mode i.e. in which messages are exchanged in brief time slots. As the correction value is not lost even if the device is switched over or turned off, such an arrangement for compensating for the DC component can therefore be used particularly in multiplex or TDMA systems such as GSM. Furthermore, it is advantageous that the dynamic range of the subsequent circuits i.e. of the circuits processing the DC compensated signal, is additionally extended considerably.

The DC compensation signal can be simply formed from the current count in that the arrangement for forming the DC compensation signal comprises converting means which are provided for converting the high-value counts of the counting device to a proportional analog value. For converting the count of the counting device to the DC compensation signal, the count can be converted to an analog voltage value by a digital-to-analog converter, for example.

The DC compensation signal can be easily smoothed in that the arrangement comprises smoothing means provided for smoothing a high-value output of the counting device. In an extremely simple embodiment one of the high-value outputs of the counter is led to a capacitor. With an accordingly high-ohmic load of the capacitor and an accordingly high counting speed of the counter, this integrating capacitor needs to have only very little capacitance, as a result of which this capacitor can also be integrated.

The useful life of the batteries present in the device, especially in handhelds whose batteries have a limited service life depending on the size of the handheld, may be extended in that the arrangement for compensating for the DC component is structured in such a way that the value of the DC compensation signal, which value is available when a switching signal for saving current is supplied, is retained in the turned-off state. Preferably, the arrangement for DC compensation is to be designed such that when a switching signal for saving current occurs, the circuit can be rendered inoperative or be switched to a state in which the power consumption is very low. When the circuit is turned on again, means are to be available that set the DC compensation signal to a value it had at the instant the circuit was turned off. One of these means is that when the switching signal for saving current occurs, the count is buffered and is set accordingly when the counting operation is resumed. Such an arrangement for DC compensation is especially suitable for applications in which the operating time of the electrical device is interrupted by pauses in which several circuit components are turned off for the purpose of saving current. If a coupling capacitor is used, there would be the problem that the coupling capacitor would discharge within the pause intervals. If a coupling capacitor having a rather large capacitance is used for transmitting very low frequency signal components, there would be adjusting times which would prevent the electronics from being turned off.

If the counting device has means for interrupting the counting process by means of the switching signal for saving current, the DC compensation signal can be simply stored during the turn-off intervals by interrupting the counting process of the counting device.

If the arrangement for compensating for the PC component is provided at the input of a digital signal processor stage, in radio transceivers the arrangement can reduce low frequency signal components when high frequency signals are converted to the baseband domain. For DC isolation of such signals having a low limit frequency, a corresponding coupling capacitor would otherwise have a very large capacitance. In contrast, with the proposed circuit arrangement, the limit frequency only depends on the clock frequency and on the maximum count possible. As integrated counter stages for achieving a high maximum count need little space, contrary to the space required by a corresponding coupling capacitor, limit frequencies of below one Hertz can be achieved without any problem in this manner.

The DC component can be set exactly to a reference value in that a comparing circuit for comparing the signal difference with a reference value is provided to determine the DC component. A comparator comparing the DC component with a reference value is highly suitable as a comparing circuit to measure the DC component. This makes it possible to set at the output of the DC compensation arrangement a DC operating point exactly defined by the reference voltage, at which operating point the AC component of the signal is exactly symmetrical. In integrated circuits this reference voltage preferably corresponds to the central bias voltage with which all the stages are supplied.

For the AC voltage signal not to have any influence on the DC compensation, the arrangement for compensating for the DC component comprises integration means for a time-division integration of the signal difference. As a result, the measured DC component will be subjected to an averaging over time when the DC compensation signal is generated. The integration time is to be selected considerably longer than the reciprocal value of the lowest frequency valid signal components. Preferably, the means for time-division integration are to be selected such that they can be integrated as they require little space. The counting device is provided as an integration means in a preferred embodiment.

BRIEF DESCRIPTION OF THE DRAWINGS

The invention will now be further described with reference to the embodiments shown in the drawing Figures, in which.

DETAILED DESCRIPTION OF THE PREFERRED EMBODIMENTS

Figure 1:
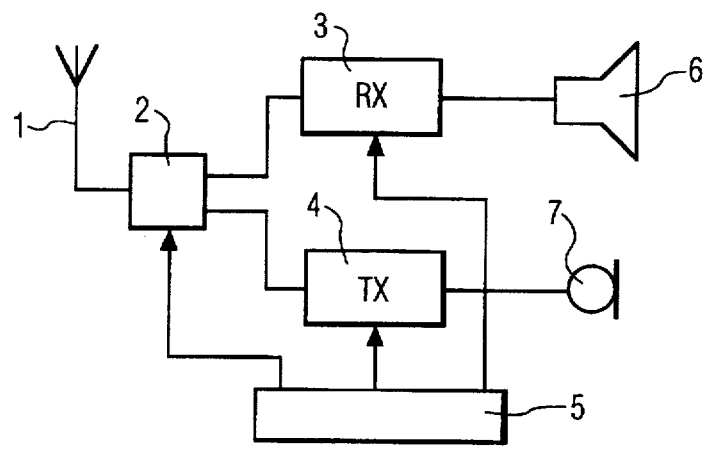
FIG. 1 gives a diagrammatic representation of a radio transceiver.

The embodiment shows a mobile radio set for time-division multiple access (TDMA) in which transmit and receive signals are transmitted and received respectively, time-compressed as data packets at different instants. For this purpose, a common antenna 1 suffices, which antenna is connected via an antenna switch 2 either to a receiving section 3 or a transmitting section 4 of the radio transceiver. A control circuit 5 is provided for controlling the antenna switch 2, the receiving section 3 and the transmitting section 4. The received signal is processed in known manner in that it is reproduced via a loudspeaker 6. Spoken signals are recorded by a microphone 7 and are also processed in known manner by the transmitting section 4.

Control circuit 5 comprises, more specifically, a controlling section for generating turn-off signals. Individual sub-assemblies can be separately brought to a current-saving state by means of the turn-off signals. While, for example, the signal processing in the low-frequency area is to be continuously turned on during a radio conversation to guarantee continuous speech input and output, the high frequency transmitting and receiving sections are to be capable of operating only during their assigned time slots. In the time intervals lying between the assigned time slots, the relevant transmitting and receiving sections can thus be brought to a state in which current is saved.

Figure 2:
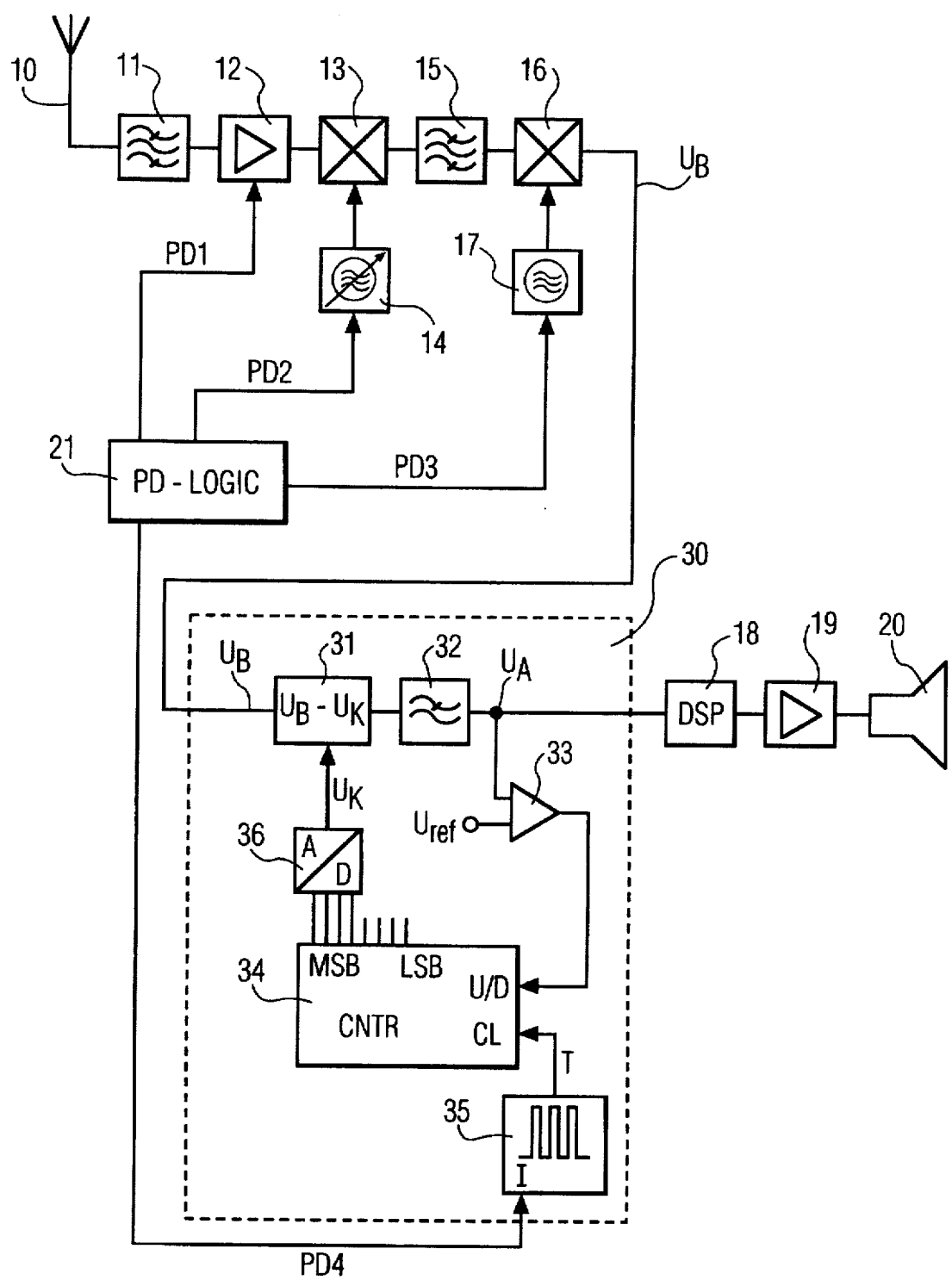
FIG. 2 gives a diagrammatic representation of the receiving section of a radio transceiver which comprises a current-saving circuit and a first embodiment for an arrangement for compensating for the DC component.

FIG. 2 shows the receive circuit of the radio transceiver diagrammatically shown in FIG. 1. The input signal received via the antenna 10 is preselected in a band filter 11 and amplified in a HF amplifier 12. The amplified signal is applied to a HF mixer 13 which also receives a first mixing signal from a local oscillator 14 and in which mixer the signals are connected to a first intermediate frequency. The intermediate frequency signal filtered in an intermediate frequency filter 15 is subsequently converted to a baseband signal $U_B$ in a baseband mixing stage 16 by means of a second mixing signal coming from a baseband oscillator 17. This baseband signal $U_B$ forms the input signal of an arrangement 30 for compensating for the DC component.

Depending on the modulation method used on the transmitting side, the baseband signal $U_B$ may contain very-low-frequency signal components which must not be disregarded for an equalization and decoding of the signal. On the other hand, the baseband signal $U_B$ also comprises a DC component which would reduce the dynamic range in the subsequent digital signal processing in a digital signal processor 18. For this reason, the arrangement 30 for compensating for the DC component to be described hereafter is inserted between the output of the baseband mixer 16 and the input of the digital signal processor 18.

The arrangement 30 for DC compensation comprises a circuit 31 for forming a signal difference, the circuit being supplied on a first input with the baseband signal $U_B$ and on a second input with a DC compensation signal $U_K$. The circuit for forming a signal difference, for example, an accordingly connected differential amplifier, forms the signal difference $U_B-U_K$ between the baseband signal $U_B$ and the DC compensation signal $U_K$. The difference signal $U_B-U_K$ is applied to the signal processor 18 and a to comparator 33 via a low-pass filter 32.

The voltage comparator 33 compares the filtered difference signal $U_B-U_K$ with a reference value $U_{ref}$. As will be described in detail, it is possible with the reference voltage $U_{ref}$ to set the DC component of the output signal $U_A$ of the DC compensation arrangement 30 exactly to the reference voltage $U_{ref}$. The result of the comparison by the voltage comparator 33 is applied to the count direction input U/D of a counting device 34 arranged as an up/down-counter. A clock signal generated by a clock generator 35 is applied to the clock input C1 of the counter 34. The counter 34 is a binary counter whose output signals correspond to the individual bits of the result of the counter. The most significant output signals of the counter 34 are applied to a digital-to-analog converter 36.

The output of the voltage comparator 33 produces a binary signal by which the count direction U/D of the counter 34 is controlled in such a way that if a difference signal $U_B-U_K$ exceeds the reference voltage $U_{ref}$ an up-counting takes place. In this manner the count of the counter 34 is incremented and thus also the DC compensation signal $U_K$ is increased if the difference signal lies above the reference voltage $U_{ref}$. If the signal difference $U_B-U_K$ lies below $U_{ref}$, the reverse is true. The smoothing time constant which is obtained with this arrangement, depends on the bit length N of the counter 34 and on the clock frequency T of the clock generator 35. The smoothing time constant is the result of the quotient of the maximum count $2^{N-1}$ and of the clock frequency f.

The smoothing time constant is to be selected such that it exceeds the period duration of the low-frequency signal component in the input signal $U_B$. On the other hand, according to the scanning theorem, the clock frequency of the clock generator 35 is to be twice as high as the maximum input frequency that is to be processed. The limit frequency of the low-pass filter 32 is to be selected accordingly. In GSM equipment one has to start from, for example, a maximum usable frequency of about 100 kHz of the baseband signal $U_B$.

Figure 3:
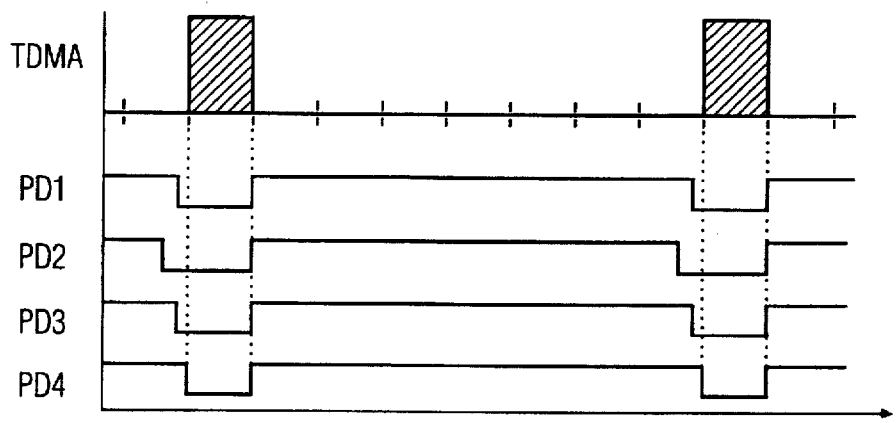
FIG. 3 shows a time diagram with the signals of a current-saving circuit.

During the receive pauses between the time slots there is provided a current controller (PD Logic) 21 which is to set the individual circuit components to a state of current-saving and generates the associated control signals PD1, PD2, PD3 and PD4. To explain the function of the current controller 21, FIG. 3 shows the output signals of the current controller 21 plotted against the received TDMA time slot. The first current-saving control signal PD1 controls the power consumption of the HF amplifier 12. Due to the adjusting times of the HF amplifier 12, the current-saving signal is to be such that it again puts the HF amplifier 12 in operation in accordance with the adjusting time of the HF amplifier 12 before the beginning of the associated time slot. At the end of the receive time slot the HF amplifier 12 can again be set to the state of current saving. The current-saving control signals PD2 for the local oscillator 14 and PD3 for the baseband oscillator 17 take an accordingly longer adjusting time of these oscillators into account. The current-saving control signal PD4 for the arrangement 30 for DC compensation, on the other hand, does not need to take any adjusting times into consideration and resets the arrangement 30 for DC compensation at the beginning of the time slot to be processed from the state of current saving to the active state and, at the end of the time slot to be received, from the active state to the state of current saving. The current-saving control signal PD4 is then led to a control input I (Inhibit) of the clock generator 35. When the current-saving control signal PD4 is available, the generation of the clock T by the clock generator 35 is interrupted. An appropriate structure of the counter 34 provides that the internal registers of the counter 34 retain their register states until a new clock signal arrives.

As the power consumption in integrated modules, especially the CMOS modules, particularly depends on the clock frequency, the power consumption of the arrangement 30 for DC compensation is drastically lowered in that the clock signal T is interrupted. Except for the clock signal being turned off, no further measures for reducing the power consumption or for storing the DC compensation signal are necessary in this manner.

Figure 4:
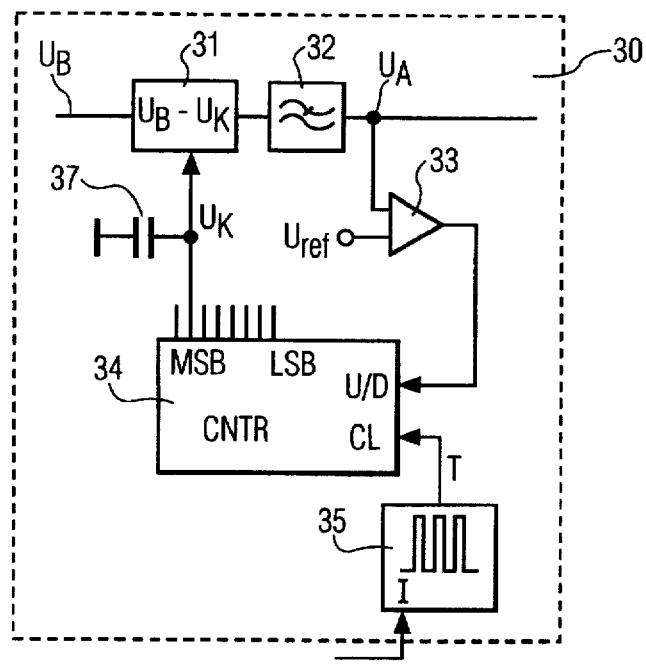
FIG. 4 shows a further embodiment for an arrangement for compensating for the DC component.

FIG. 4 shows a very simple embodiment for the DC compensation arrangement 30. The receiver components shown in FIG. 2 have been omitted. Instead of applying various high-value output signals of the counter 34 to a digitizer, only a single one of the high-value output signals of the counter 34 is applied to the circuit 31 for forming the signal difference. Only a single capacitor 37 inserted between ground and the output used of the counter 34 is arranged for smoothing the DC compensation signal $U_K$. In order to preclude an erroneous function when the counter 34 presents an overflow, it is suitable under given conditions not to use the most-significant output signal (MSB) of the counter 34 to produce the DC compensation signal $U_K$. With a high-ohmic load of the smoothing capacitor 37 its capacitance may be selected to be very small, so that this smoothing capacitor 37 also allows of integration. With this simple embodiment it is thus possible to reduce the required space of a digitizer to the space required for the smoothing capacitor 37.

We claim:

1. A radio transceiver comprising an arrangement for compensating for a DC component in an input signal to be processed, the compensating arrangement comprising means for forming the signal difference between the input signal and a DC compensation signal depending on a DC component found, wherein the arrangement for compensating for the DC component comprises a counting device whose count direction is determined by the DC component found.

2. The radio transceiver as claimed in claim 1, wherein the arrangement for forming the DC compensation signal comprises converting means used for converting the high-value counts of the counting device to a proportional analog value.

3. The radio transceiver as claimed in claim 1, wherein the arrangement comprises smoothing means used for smoothing a high-value output signal of the counting device.

4. The radio transceiver as claimed in claim 1, wherein the arrangement for compensating for the DC component is structured in such a way that the value of the DC compensation signal ($U_K$), which value occurs when a current-saving signal (PD4) is available, is retained in the turned-off state.

5. The radio transceiver as claimed in claim 1, wherein the counting device comprises means for interrupting the counting process by a current-saving signal.

6. The radio transceiver as claimed in claim 1, wherein the counting device has a clock input, in that a clock generator is provided for generating a clock signal to be applied to the clock input of the counting device and in that a current-saving signal is used for interrupting the generation of the clock.

7. The radio transceiver as claimed in claim 1, wherein the radio transceiver operating in the time-division multiple access mode (TDMA).

8. The radio transceiver as claimed in claim 1, wherein the arrangement for compensating for the DC component is arranged at the input of a digital signal processor stage (18).

9. The radio transceiver as claimed in claim 1, wherein a comparator means (33) for comparing the signal difference $(U_B-U_K)$ with a reference value $(U_{ref})$ is arranged for determining the DC component.

10. The radio transceiver as claimed in claim 1, wherein the arrangement (30) for compensating for the DC component comprises integration means (34,35) for the time-division integration of the signal difference $(U_B-U_K)$.

11. A radio transceiver comprising:

a counter for outputting a DC compensation signal;

first means for receiving a input signal including at least a DC component and for receiving said DC compensation signal, said first means forming a signal difference between the input signal and said DC compensation signal;

a comparator for comparing said signal difference and a reference signal;

wherein said counter, coupled to said comparator, increases and decreases said DC compensation signal based on said output of said comparator and wherein said incrementation or decrementation of said counter is based on the DC component of said signal difference.

12. The radio transceiver as claimed in claim 11, wherein said reference signal is a DC voltage at least substantially equal to the voltage of said DC component.

13. The radio transceiver as claimed in claim 11, wherein said first means includes converting means, coupled to said counter, for converting the high-value counts of the counter to a proportional analog value.

14. The radio transceiver as claimed in claim 11, including smoothing means, coupled to said first means and said counter, for smoothing the DC compensation signal outputted from the counter.

15. The radio transceiver as claimed in claim 11, wherein the value of the DC compensation signal, said value occurring when a current-saving signal is available, is retained in the turned-off state.

16. The radio transceiver as claimed in claim 11, wherein the counter includes means for interrupting the counting process by a current-saving signal.

17. The radio transceiver as claimed in claim 11, wherein the counter includes a clock input and a clock generator, and a current-saving signal is used for interrupting the generation of the clock.

18. The radio transceiver as claimed in claim 11, and including an input stage for receiving an RF input signal and outputting said input signal and a digital signal processor stage; wherein said signal difference is an input to said digital signal processor stage.

19. A handheld mobile radio set, said mobile radio set comprising:

a transmitter; and a receiver, said receiver including a counter for outputting a DC compensation signal, receiving means for receiving a input signal including at least a DC component and for receiving said DC compensation signal, said receiving means forming a signal difference between the input signal and said DC compensation signal, a comparator for comparing said signal difference and a reference signal; and wherein said counter, coupled to said comparator, increases and decreases said DC compensation signal based on said output of said comparator whereby said incrementation or decrementation of said counter is based on the DC component of said signal difference.

* * * * *